United States Patent
Chang et al.

(10) Patent No.: US 7,166,525 B2
(45) Date of Patent: Jan. 23, 2007

(54) HIGH TEMPERATURE HYDROGEN ANNEALING OF A GATE INSULATOR LAYER TO INCREASE ETCHING SELECTIVITY BETWEEN CONDUCTIVE GATE STRUCTURE AND GATE INSULATOR LAYER

(75) Inventors: Vincent S. Chang, Hsinchu (TW); Chia-Lin Chen, Hsinchu (TW); Chi-Chun Chen, Kaohsiung (TW); Tze-Liang Lee, Hsinchu (TW); Shih-Chang Chen, Hsin-Chu (TW); Chien-Hao Chen, Ilan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 163 days.

(21) Appl. No.: 10/758,317

(22) Filed: Jan. 15, 2004

(65) Prior Publication Data

US 2005/0159008 A1 Jul. 21, 2005

(51) Int. Cl.
*H01L 21/4763* (2006.01)
*H01L 21/3205* (2006.01)
(52) U.S. Cl. ............... 438/585; 438/587; 438/591; 438/791
(58) Field of Classification Search ............... None
See application file for complete search history.

(56) References Cited

U.S. PATENT DOCUMENTS

| | | | |
|---|---|---|---|
| 6,245,616 B1 * | 6/2001 | Buchanan et al. | 438/287 |
| 6,335,278 B1 | 1/2002 | Miyazaki | 438/660 |
| 6,387,761 B1 * | 5/2002 | Shih et al. | 438/287 |
| 6,559,007 B1 * | 5/2003 | Weimer | 438/257 |
| 6,569,741 B1 | 5/2003 | Houston et al. | 438/290 |
| 6,649,538 B1 * | 11/2003 | Cheng et al. | 438/775 |
| 6,821,868 B1 * | 11/2004 | Cheng et al. | 438/517 |
| 2002/0197880 A1 * | 12/2002 | Niimi et al. | 438/763 |
| 2003/0232491 A1 * | 12/2003 | Yamaguchi | 438/591 |

* cited by examiner

*Primary Examiner*—Duy-Vu Deo
(74) *Attorney, Agent, or Firm*—Haynes and Boone, LLP

(57) ABSTRACT

A method of defining a conductive gate structure for a MOSFET device wherein the etch rate selectivity of the conductive gate material to an underlying insulator layer is optimized, has been developed. After formation of a nitrided silicon dioxide layer, to be used as for the MOSFET gate insulator layer, a high temperature hydrogen anneal procedure is performed. The high temperature anneal procedure replaces nitrogen components in a top portion of the nitrided silicon dioxide gate insulator layer with hydrogen components. The etch rate of the hydrogen annealed layer in specific dry etch ambients is now decreased when compared to the non-hydrogen annealed nitrided silicon dioxide counterpart. Thus the etch rate selectivity of conductive gate material to underlying gate insulator material is increased when employing the slower etching hydrogen annealed nitrided silicon dioxide layer.

20 Claims, 3 Drawing Sheets

HIGH TEMPERATURE HYDROGEN ANNEALING OF A GATE INSULATOR LAYER TO INCREASE ETCHING SELECTIVITY BETWEEN CONDUCTIVE GATE STRUCTURE AND GATE INSULATOR LAYER

BACKGROUND OF THE INVENTION (1) Field of the Invention

The present method relates to methods used to fabricate semiconductor devices, and more specifically to a method used to increase the etch rate selectivity of a dry etch procedure employed for the definition of a conductive gate structure.

(2) Description of Prior Art

Micro-miniaturization, or the ability to fabricate semiconductor devices with sub-micron features, has allowed performance increases for the sub-micron MOSFET devices to be realized, basically via reductions in performance degrading junction capacitances. Sub-micron MOSFET devices are also being fabricating featuring thin silicon dioxide gate insulator layers, used to allow operating voltages to be decreased. The use of thinner silicon dioxide layers however can present higher leakage currents than counterparts comprised with thicker silicon dioxide gate insulator layers. Formation of nitrided gate insulator layers such as a nitrided silicon dioxide layer, can however reduce leakage in thin gate insulator layers. The higher dielectric constant of the nitrided gate insulator layer when compared to non-nitrided silicon dioxide gate insulator counterparts, as well as maintaining an equivalent oxide thickness (EOT), result in lower leakage currents thus making nitrided silicon dioxide gate insulator layer an attractive option for sub-micron MOSFET devices.

The employment of nitrided gate insulator layer can however present difficulties during definition of an overlying conductive gate structure. Selective dry etch procedures employed for gate structure definition are designed to terminate at the exposure of the gate insulator layer in areas not covered by the now defined gate structure, at dry etch end point. This is accomplished via a high etch rate ratio between the conductive gate structure material, such as polysilicon, and the underlying gate insulator material, such as silicon dioxide. However the presence of the underlying nitrided silicon dioxide layer, featuring an undesirable faster etch rate than non-nitrided silicon dioxide, results in a decreased etch rate ratio. The lower etch rate selectivity resulting form the presence of nitrided silicon dioxide underlays adds complexity and difficulty to end point control for the conductive gate structure, selective dry etch definition procedure, sometimes resulting in break through of the nitrided silicon dioxide layer and unwanted pitting or damage of underlying semiconductor substrate regions. The damaged semiconductor regions, subsequently used to accommodate MOSFET features such as source/drain regions, can result in decreased MOSFET yield, performance and reliability.

The present invention will describe a procedure in which nitrided gate insulator layers can be employed as a component of a sub-micron MOSFET device, while still allowing the high etch rate ratio of conductive gate material to nitrided gate insulator material to be maintained. This is accomplished via a simple process step performed to the nitrided gate insulator material prior to deposition of the material used for the conductive gate structure. Prior art such as Miyazaki, in U.S. Pat. No. 6,335,278 B1, as well as Houston et al, in U.S. Pat. No. 6,569,741 B2, have described annealing procedures employed to remedy device leakage problems. However none of the above prior art offer the process described in this present invention in which a nitrided gate insulator layer is treated prior to deposition of a conductive gate material to maintain a high etch rate ratio for a subsequent dry etch procedure employed for the definition of a conductive gate structure.

SUMMARY OF THE INVENTION

It is an object of this invention to fabricate a MOSFET device featuring an ultra-thin, less than 20 Angstroms, gate insulator layer.

It is another object of this invention to employ a nitrided silicon dioxide layer as a gate insulator for a MOSFET device.

It is still another object of this invention to perform a high temperature hydrogen anneal procedure prior to deposition of the conductive gate material to increase the etch rate ratio of the conductive gate material to the nitrided gate material for a conductive gate definition procedure.

In accordance with the present invention a method of increasing the etch selectivity between a conductive gate material and an underlying nitrided gate insulator material during a conductive gate dry etch definition procedure, via a hydrogen anneal procedure performed prior to deposition of the conductive gate layer, is described. After formation of a silicon dioxide gate insulator layer on a semiconductor substrate, a nitrogen treatment is performed resulting in a nitrided gate insulator layer. An anneal procedure, accomplished in a hydrogen containing ambient at a temperature between about 800 to 1100° C., is next performed on the underlying nitrided silicon dioxide gate insulator layer. After formation of a doped polysilicon layer, and of an overlying photoresist shape, a dry etch procedure is employed to define a polysilicon gate structure on an underlying hydrogen annealed, nitrided silicon dioxide gate insulator layer with the dry etch procedure selectively terminating at the appearance of portions of the hydrogen annealed nitrided silicon dioxide layer not covered by the defined polysilicon gate structure. An additional embodiment of this invention is the hydrogen annealing of a thin silicon dioxide gate insulator layer, again performed to improve the etch selectivity between the conductive gate material and the underlying, hydrogen annealed silicon dioxide layer, during the conductive gate structure definition procedure.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
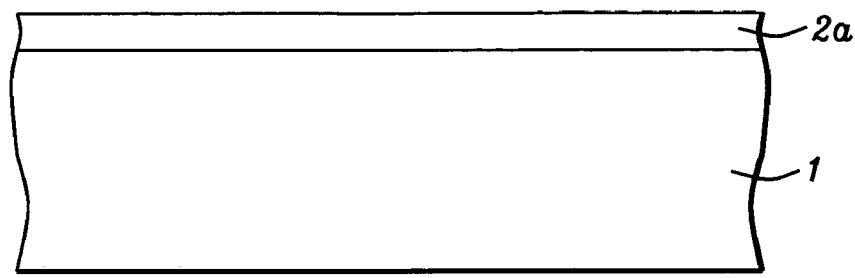
FIGS. 1–7, which schematically, in cross-sectional style, describe key stages used to fabricate a MOSFET device featuring a high temperature hydrogen anneal procedure performed on a nitrided gate insulator layer prior to deposition of a conductive gate structure material to increase the etch rate ratio of the conductive gate material to an underlying nitrided gate insulator material during a subsequent conductive gate structure dry etch definition procedure.

The method of defining a MOSFET conductive gate structure on an underlying nitrided gate insulator layer, wherein the etch rate ratio of the conductive gate material to the underlying nitrided gate insulator material is increased via a high temperature hydrogen anneal procedure performed to the nitrided gate insulator layer prior to deposition of the conductive gate material, will now be described in detail. Semiconductor substrate 1, comprised of P type single crystalline silicon, featuring a <100> crystallographic orientation, is used and schematically shown in FIG. 1. Thermal oxidation procedures are next employed at a temperature between about 700 to 1100° C., in an oxygen or steam ambient, resulting in the growth of silicon dioxide gate insulator layer 2a, at a thickness between about 10 to 30 Angstroms, and featuring a dielectric constant between about 3.8 to 4.0. This is schematically shown in FIG. 1.

Figure 2:
Figure 2:
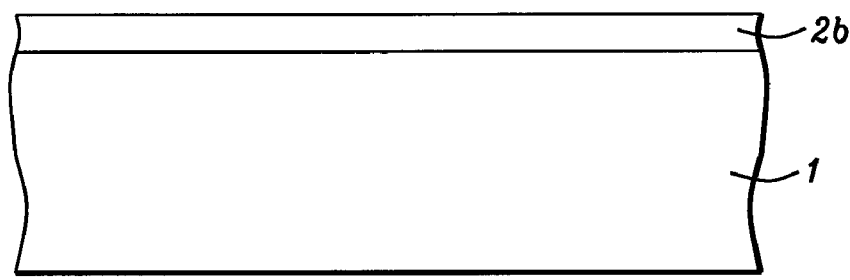

The integrity of thin silicon dioxide layers needed for sub-micron MOSFET applications, can however be less in terms of leakage current when compared to thicker gate insulator counterparts. One method of improving gate insulator integrity while still maintaining an equivalent oxide thickness, is the formation of nitrided silicon dioxide layers via nitridization of top portions of thin silicon dioxide layers. Methods such as plasma nitridation or annealing performed in nitrogen containing ambient 3, can be used to form a nitrided silicon dioxide layer. For this description silicon dioxide layer 2a, is subjected to a plasma nitridation procedure performed in a plasma tool at a power between 10 to 5,000 watts, for a time that is sufficient to obtain a desired nitrogen content in ambient 3, wherein ambient 3, is comprised of either nitrogen and helium, or nitrogen and argon. Resulting nitrided silicon dioxide layer 2b, now comprised with a dielectric constant between about 3.9 to 7.8, with an equivalent oxide thickness between about 7 to 20 Angstroms, is schematically shown in FIG. 2. If desired nitrided silicon dioxide layer 2b, can be obtained via subjection of silicon dioxide layer 2a, to an anneal procedure performed at a temperature between about 600 to 1100° C., for a time that is sufficient to obtain the desired nitrogen content in ambient 3, in an ambient comprised of either $NH_3$, NO, or $N_2O$.

The nitrided silicon dioxide layer is comprised with the highest concentration of nitrogen located at top surface of the layer. The presence of the high nitrogen concentration at the top surface of nitrided silicon dioxide layer 2b, can present difficulties during a subsequent dry etching procedure used for conductive gate structure definition. It is desirable for the conductive gate structure definition procedure to feature a high etch rate ratio for the conductive gate material in relation to the underlying gate insulator layer so that at end point, or after definition of the conductive gate structure, the dry etch procedure will slow or terminate at the appearance of the top surface of gate insulator layer. Without this desired etch rate selectivity portions of the semiconductor substrate, to be used for subsequent MOSFET device regions, can be vulnerable to the dry etch procedure. The presence of a nitrogen containing top surface for nitrided silicon dioxide layer 2b, however reduces the etch rate selectivity between conductive gate material and the underlying gate insulator layer when compared to counterparts in which the underlying gate insulator layer is comprised with only silicon dioxide or with nitrided silicon dioxide layers featuring lower nitrogen concentrations. Therefore a method of reducing nitrogen concentration at the top surface of nitrided silicon dioxide layer 2b, a method needed to increase the etch rate selectivity of a subsequent conductive gate structure dry etch procedure, has been developed.

Figure 3:
Figure 3:
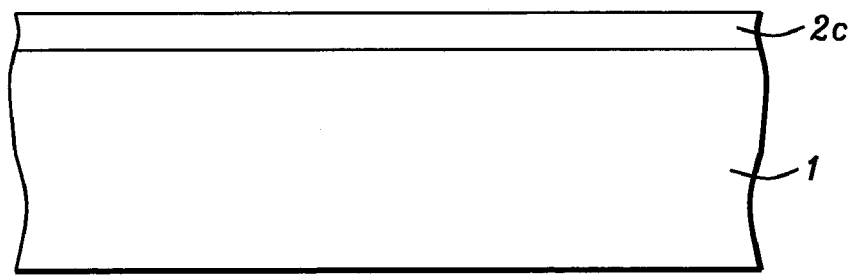

After formation nitrided silicon dioxide layer 2b, an anneal procedure is performed in hydrogen ambient 4, at a temperature between about 800 to 1100° C., for a time between about 0.5 to 10 min. The high temperature hydrogen anneal replaces nitrogen in a top portion of nitrided silicon dioxide layer 2b, with hydrogen, now resulting in hydrogen annealed nitrided silicon dioxide layer 2c. This is schematically shown in FIG. 3. The high temperature hydrogen anneal procedure has to be performed prior to deposition of a conductive gate material, and a first embodiment of this invention entails the anneal procedure performed in single wafer rapid thermal annealing (RTP) system or a batch type furnace system, either performed at the above conditions, that is 800 to 1100° C., for a time between about 0.5 to 10 min. If desired a second embodiment of this invention entails the high temperature hydrogen anneal procedure being performed in situ in the same tool to be used for deposition of polysilicon, with the anneal performed prior to polysilicon deposition, at a temperature between about 600 to 800° C., for a time between about 30 to 150 sec., using a hydrogen/nitrogen ratio that features a hydrogen percentage between about 10–50.

Figure 4:
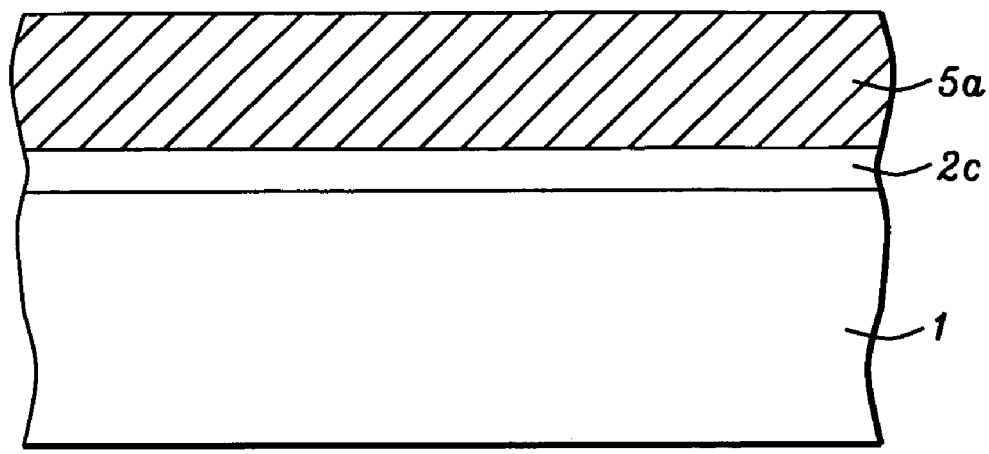

Deposition of conductive layer 5a, a layer comprised of a material such as a doped polysilicon, is next addressed and schematically shown in FIG. 4. Doped polysilicon layer 5a, is deposited at a thickness between about 500 to 2000 Angstroms via a low pressure chemical vapor deposition (LPCVD) procedure. Doping of the polysilicon layer can be accomplished in situ during deposition via the addition of arsine or phosphine to a silane, or to a disilane ambient, or the polysilicon layer can be deposited intrinsically then doped via implantation of arsenic or phosphorous ions. If desired a metal silicide layer such as tungsten silicide, or a metal layer such as tungsten, can be used as the conductive layer, however the critical sequence is the high temperature hydrogen anneal performed prior to deposition of the conductive layer.

Figure 5:
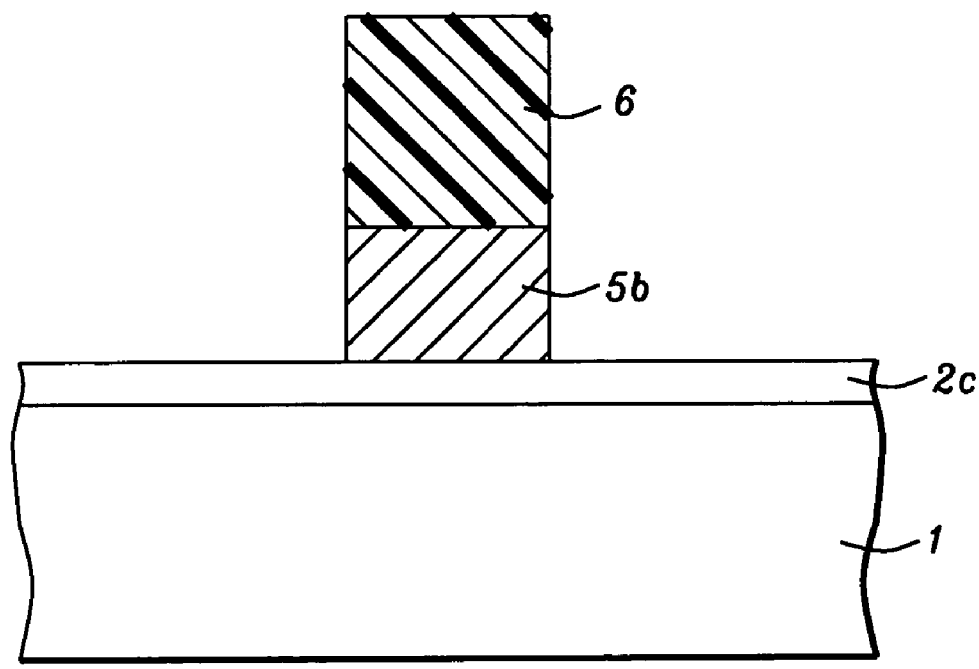

Definition of a conductive gate structure, via a selective dry etch procedure, is next addressed and schematically described using FIG. 5. Photoresist shape 6, with a width between about 400 to 12,000 Angstroms is formed on conductive layer 5b, then used as an etch mask to allowing conductive gate structure 5b, to be defined. The dry etch procedure is an anisotropic reactive ion etch (RIE) procedure, employing $Cl_2$ or $CF_4$ as a selective etchant for conductive layer, or for doped polysilicon layer 5a. The RIE procedure is selective in that the end point for the definition of polysilicon gate structure 5b, is accomplished when the RIE procedure slows or terminates at the appearance of hydrogen annealed, nitrided silicon dioxide layer 2c. The etch rate ratio of doped polysilicon to the hydrogen annealed, nitrided silicon dioxide layer, is between about 200 to 1, to 400 to 1. This high etch rate ratio allowed termination of the conductive gate structure definition procedure to terminate at the surface, or in a top portion of hydrogen annealed, nitrided silicon dioxide layer 2c. Without the conversion of a top portion of the nitrided silicon dioxide layer to a layer comprised with hydrogen termination of the conductive gate structure definition procedure would be difficult, possibly resulting in damage or pitting of the portions of semiconductor substrate not overlaid by the conductive gate structure, and possibly resulting in unwanted decreases in MOSFET device performance and yield. After definiton of conductive, or polysilicon gate structure 5b, photoresist shape 6, is removed via plasma oxygen ashing procedures.

The desired high etch rate selectivity between a conductive gate material and an underlying gate insulator layer obtained via high temperature annealing of the gate insulator layer prior to deposition of the conductive gate material, can also be applied to non-nitrided silicon dioxide gate insulator layers. Again the anneal procedure can either be performed in a rapid thermal annealing or batch type furnace system, or the anneal procedure can be performed in situ in the same tool to be subsequently used for polysilicon deposition. The hydrogen anneal conditions used for the non-nitrided, silicon dioxide gate insulator layer are identical to the anneal conditions detailed in the previous embodiments featuring nitrided silicon dioxide layers. The hydrogen annealing of a non-nitrided silicon dioxide layer results in improved etch rate selectivity between polysilicon and hydrogen annealed silicon dioxide when compared to the etch rate selectivity between polysilicon and non-hydrogen annealed silicon dioxide.

Figure 6:
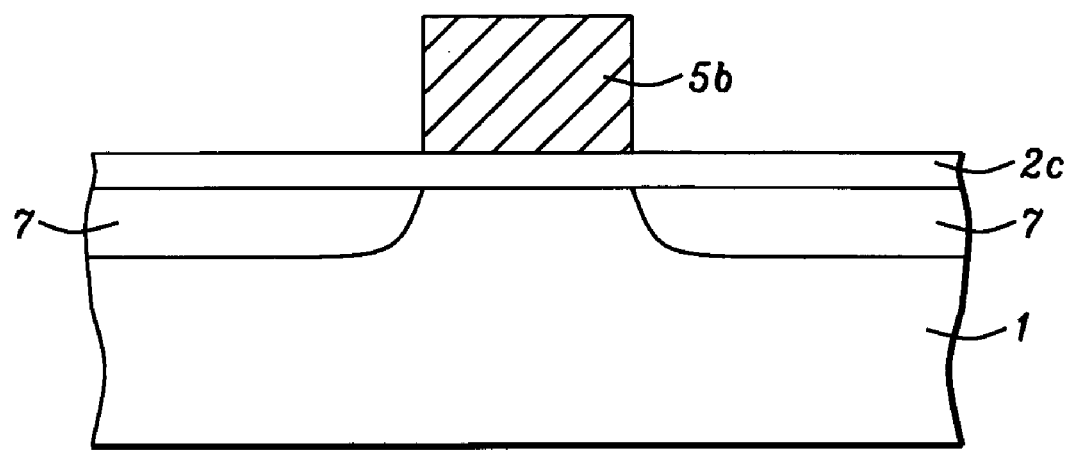

Formation of lightly doped source/drain (LDD) region 7, is next addressed in a region of semiconductor substrate 1, not covered by conductive gate structure 5b, via implantation of arsenic or phosphorous ions, implanted at an energy between about 1 to 10 KeV, at a dose between about 1 E14 to 1 E16 atoms/cm$^2$. If damaged had occurred to the portion of semiconductor substrate 1, accommodating LDD region 7, MOSFET leakage phenomena may have resulted. However the presence of hydrogen annealed, nitrided silicon dioxide layer 2c, protected this semiconductor region during conductive gate structure definition procedure thus preventing damage or pitting of this semiconductor region. The result of this procedure is schematically shown in FIG. 6.

Figure 7:
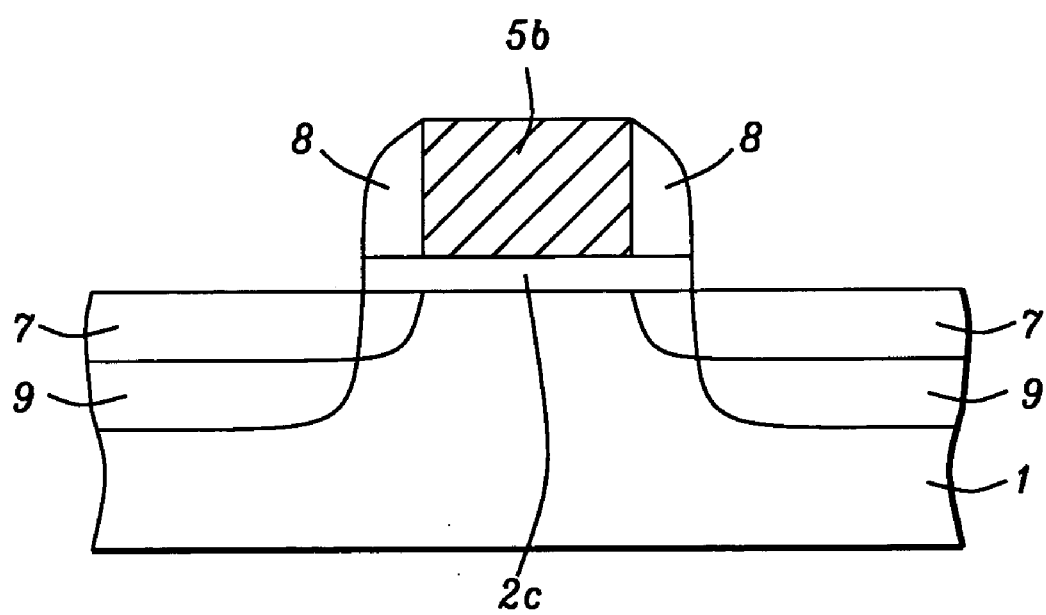

The completion of the MOSFET device comprised with a hydrogen annealed, nitrided silicon dioxide gate insulator layer will now be addressed and schematically shown in FIG. 7. An insulator layer such as silicon oxide or silicon nitride is deposited at a thickness between about 400 to 700 Angstroms, via LPCVD or via plasma enhanced chemical vapor deposition (PECVD) procedures. An anisotropic RIE procedure using $CHF_4$ or $CF_4$ as an etchant for the insulator layer is used to define insulator spacers 8, located on the sides of conductive gate structure 5b. In addition the insulator spacer defining anisotropic RIE procedure selectively removes the portions of hydrogen annealed, silicon dioxide layer 2c, not covered by either conductive gate structure 5b, or by insulator spacers 8. The anisotropic RIE procedure, using the above etchants, selectively terminates at the appearance of semiconductor substrate 1. Heavily doped source/drain region 9, is next formed via implantation of arsenic or phosphorous ions in exposed portions of semiconductor substrate 1, using an implant energy between about 5 to 30 KeV, and a dose between about 1 E14 to 1 E16 atoms/cm$^2$. An anneal procedure can now be employed to activate the implanted species in LDD region 7, and in heavily doped source/drain region 9.

Although this invention was described for an N channel MOSFET device, it should be understood that the hydrogen annealed, nitrided silicon dioxide gate insulator layer can be applied to P channel MOSFET device, or to CMOS devices comprised with both N channel and P channel MOSFET devices.

While this invention has been particularly shown and described with reference to, the preferred embodiments thereof, it will be understood by those skilled in the art that various changes in form and details may be made without departing from the spirit and scope of this invention.

What is claimed is:

1. A method of forming a metal oxide semiconductor effect transistor (MOSFET) on a semiconductor substrate, comprising the steps of:

forming a silicon dioxide gate insulator layer on said semiconductor substrate;

performing a plasma nitridation procedure on the silicon dioxide gate insulator layer to form a nitrided gate insulator layer;

performing a hydrogen anneal procedure on the nitrided gate insulator layer;

forming a conductive gate structure on a portion of said nitrided gate insulator layer;

forming a lightly doped source/drain region in an area of said semiconductor substrate not covered by said conductive gate structure;

forming insulator spacers on sides of said conductive gate structure; and forming a heavily doped source/drain region in an area of said semiconductor not covered by said conductive gate structure or by said insulator spacers.

2. The method of claim 1, wherein said gate insulator layer is obtained via a thermal oxidation procedure at a thickness between about 10 to 30 Angstroms.

3. The method of claim 1, wherein said nitrided gate insulator layer is a nitrided silicon dioxide layer, at an equivalent oxide thickness between about 7 to 20 Angstroms.

4. The method of claim 1, wherein said nitrided gate insulator layer is comprised with a dielectric constant between about 3.9 to 7.8.

5. The method of claim 1, wherein said plasma nitridation procedure is performed at a power between about 10 to 5000 watts, for a time that is sufficient to obtain a desired nitrogen content in a top portion of said gate insulator layer, with the plasma nitridation procedure performed in ambient comprised of $N_2$ and helium, or of $N_2$ and argon.

6. The method of claim 1, wherein said procedure used to form said nitrided gate insulator layer is an anneal procedure performed at a temperature between about 600 to 1100° C., for a time sufficient to obtain a desired nitrogen constant in said gate insulator layer, performed in ambient comprised of either $NH_3$, NO, or $N_2O$.

7. The method of claim 1, wherein said hydrogen anneal procedure is performed to said nitrided gate insulator layer in a single wafer rapid thermal annealing (RTP), or in a batch type furnace system, performed in a hydrogen ambient at a temperature between about 800 to 1100° C., for a time between about 0.5 to 10 min.

8. The method of claim 1, wherein said hydrogen anneal procedure is performed in situ, in the same tool to be used for deposition of a conductive gate material, with the anneal performed at a temperature between about 600 to 800° C., for a time between about 30 to 150 sec., using a hydrogen/nitrogen ratio that features a hydrogen percentage between about 10–50.

9. A method of forming a MOSFET device on a semiconductor substrate comprising the steps of:

forming a silicon dioxide insulator layer on said semiconductor substrate;

performing a plasma nitridation procedure on the silicon dioxide insulator layer to form a nitrided silicon dioxide layer;

performing a hydrogen anneal procedure on the nitrided silicon dioxide layer to form a hydrogen annealed nitrided silicon dioxide layer;

forming a polysilicon gate structure on said hydrogen annealed nitrided silicon dioxide layer;

forming a lightly doped source/drain region in an area of said semiconductor substrate not covered by said polysilicon gate structure;

forming insulator spacers on sides of said polysilicon gate structure;

forming a heavily doped source/drain region in an area of said semiconductor substrate not covered by said polysilicon gate structure or by said insulator spacers.

10. The method of claim 9, wherein said silicon dioxide later is obtained via a thermal oxidation procedure, to a thickness between about 10 to 30 Angstroms.

11. The method of claim 9, wherein said procedure used to form said nitrided silicon dioxide layer is a plasma nitridation procedure, performed at a power between about 10 to 5000 watts, for a time that is sufficient to obtain a desired nitrogen content in a top portion of said silicon dioxide gate insulator layer, with the plasma nitridation procedure performed in ambient comprised on $N_2$ and helium, or comprised of $N_2$ and argon.

12. The method of claim 9, wherein said procedure used to form said nitrided silicon dioxide layer is an anneal procedure performed at a temperature between about 600 to 1100° C., for a time sufficient to obtain a desired nitrogen content in said silicon dioxide gate insulator layer, wherein said anneal procedure is performed in ambient comprised of either $NH_3$, NO, or $N_2O$.

13. The method of claim 9, wherein said nitrided silicon dioxide layer is comprised with an equivalent oxide thickness between about 7 to 20 Angstroms.

14. The method of claim 9, wherein said nitrided silicon dioxide layer is comprised with a dielectric constant between about 3.9 to 7.8.

15. The method of claim 9, wherein said hydrogen anneal procedure is performed in a single wafer rapid thermal annealing (RTP), or in a batch type furnace system, performed in a hydrogen ambient at a temperature between about 800 to 1100° C., for a time between about 0.5 to 10 min.

16. The method of claim 9, wherein said hydrogen anneal procedure is performed in situ with the same tool to be used for deposition of a polysilicon gate material, with said hydrogen anneal procedure performed at a temperature between about 600 to 800° C., for a time between about 30 to 150 sec., using a hydrogen/nitrogen ratio that features a hydrogen percentage between about 10–50.

17. A method of forming a metal oxide semiconductor field effect transistor (MOSFET) on a semiconductor substrate, comprising the steps of:

forming a silicon dioxide gate insulator layer on said semiconductor substrate;

performing a plasma nitridation procedure on the silicon dioxide insulator layer to form a nitrided silicon dioxide insulator layer;

performing a hydrogen anneal procedure on the nitrided silicon dioxide insulator layer;

forming a polysilicon gate structure on a portion of said nitrided silicon dioxide gate insulator layer;

forming a lightly doped source/drain region in an area of said semiconductor substrate not covered by said polysilicon gate structure;

forming insulator spacers on sides of said polysilicon gate structure; and forming a heavily doped source/drain region in an area of said semiconductor substrate not covered by said polysilicon gate structure or by said insulator spacers.

18. The method of claim 17, wherein said silicon dioxide gate insulator layer is obtained via a thermal oxidation procedure at a thickness between about 10 to 30 Angstroms.

19. The method of claim 17, wherein said hydrogen anneal procedure is performed in a single wafer rapid thermal annealing (RTP), or in a batch type furnace system, performed in a hydrogen ambient at a temperature between about 800 to 1100° C., for a time between about 0.5 to 10 min.

20. The method of claim 17, wherein said hydrogen anneal procedure is performed in situ, in the same tool to be used for deposition of a polysilicon gate material, with the anneal performed at a temperature between about 600 to 800° C., for a time between about 30 to 150 sec., using a hydrogen/nitrogen that features a hydrogen percentage between about 10–50.

* * * * *